United States Patent
Ono et al.

(10) Patent No.: US 8,475,575 B2
(45) Date of Patent: Jul. 2, 2013

(54) VENT FILTER

(75) Inventors: Masashi Ono, Tokyo (JP); Takuya Ueki, Tokyo (JP)

(73) Assignee: Japan Gore-Tex Inc., Tokyo (JP)

( * ) Notice: Subject to any disclaimer, the term of this patent is extended or adjusted under 35 U.S.C. 154(b) by 203 days.

(21) Appl. No.: 13/126,125

(22) PCT Filed: Nov. 5, 2009

(86) PCT No.: PCT/JP2009/068903
§ 371 (c)(1),
(2), (4) Date: Jul. 12, 2011

(87) PCT Pub. No.: WO2010/053121
PCT Pub. Date: May 14, 2010

(65) Prior Publication Data
US 2011/0252971 A1    Oct. 20, 2011

(30) Foreign Application Priority Data
Nov. 6, 2008   (JP) .................................. 2008-285874

(51) Int. Cl.
*B01D 53/22*    (2006.01)
(52) U.S. Cl.
USPC ........ 96/4; 55/385.4; 55/462; 95/45; 454/340
(58) Field of Classification Search
USPC ............. 55/385.4, 462; 95/45; 96/4; 454/340
See application file for complete search history.

(56) References Cited

U.S. PATENT DOCUMENTS

| | | | | |
|---|---|---|---|---|
| 1,888,150 A * | 11/1932 | Walker | ............................. | 55/486 |
| 1,940,601 A * | 12/1933 | McCrery et al. | ......... | 220/203.17 |
| 3,951,293 A * | 4/1976 | Schulz | ........................... | 215/261 |
| 4,457,758 A * | 7/1984 | Norton | ........................... | 604/324 |
| 5,125,428 A * | 6/1992 | Rauter | ........................... | 137/199 |
| 5,348,570 A * | 9/1994 | Ruppert et al. | ...................... | 96/6 |
| 5,381,563 A * | 1/1995 | Isabelle et al. | .................. | 4/541.5 |
| 5,522,769 A * | 6/1996 | DeGuiseppi | ................... | 454/270 |
| 5,914,415 A * | 6/1999 | Tago | ............................. | 55/385.4 |
| 7,166,024 B2 * | 1/2007 | Mashiko et al. | ............... | 454/370 |

(Continued)

FOREIGN PATENT DOCUMENTS

| | | |
|---|---|---|
| JP | 1-138187 | 5/1989 |
| JP | 2003-63549 | 3/2003 |

(Continued)

OTHER PUBLICATIONS

International Search Report from JP2009/068903.

*Primary Examiner* — Jason M Greene
*Assistant Examiner* — Anthony Shumate
(74) *Attorney, Agent, or Firm* — Richard W Ellis

(57) ABSTRACT

An object is to provide a vent plug making liquid unlikely to accumulate therein, while preventing an air-permeable membrane from breaking by means of at least one convex part. The vent plug of the present invention includes a cylindrical member 1 having a through-hole 1a, and an air-permeable membrane 2 attached around the cylindrical member 1, wherein the air-permeable membrane 2 has a circumferential attachment region which is in contact with the cylindrical member 1, and an air-permeable region facing the through-hole 1a, the cylindrical member 1 is provided with at least one convex part 1b which projects beyond the plane including the air-permeable region, and the circumferential attachment region of the air-permeable membrane 2 has a shape following a part or the entire of the convex part 1b.

11 Claims, 8 Drawing Sheets

U.S. PATENT DOCUMENTS

| | | | |
|---|---|---|---|
| 7,936,566 B2 * | 5/2011 | Shigyo et al. | 361/752 |
| 8,246,726 B2 * | 8/2012 | Yano | 96/4 |
| 2003/0061938 A1 * | 4/2003 | Kunstadt et al. | 96/4 |
| 2005/0091949 A1 * | 5/2005 | Origlia | 55/385.4 |
| 2007/0125231 A1 * | 6/2007 | Thomas et al. | 96/4 |
| 2009/0047890 A1 * | 2/2009 | Yano et al. | 454/143 |
| 2009/0084078 A1 * | 4/2009 | Furuyama et al. | 55/385.4 |
| 2012/0174789 A1 * | 7/2012 | Ono et al. | 96/4 |

FOREIGN PATENT DOCUMENTS

| | | |
|---|---|---|
| JP | 2005-158909 | 6/2005 |
| JP | 2007-230448 | 9/2007 |
| JP | 2008-059998 | 3/2008 |

* cited by examiner (a)

(b)

(a)

(b)

(a)

(b)

(a)

(b)

VENT FILTER

TECHNICAL FIELD

The present invention relates to a vent plug with an air-permeable membrane that has the function of blocking liquid, such as water droplets and oil droplets, while allowing gas to pass therethrough.

BACKGROUND ART

Electric devices, such as headlamps, tail lamps, fog lamps, power windows, pressure sensors, pressure switches, and engine control units of automobiles, are used in an environment in which they are exposed to liquid, such as water, oil, and surfactants. Further, also among general home appliances, electric razors, mobile phones, electric toothbrushes, and others are used in an environment in which they are exposed to liquid, such as water, oil, and surfactants. In these electric devices, a case for putting electronic components therein needs to be highly waterproof. If, however, the case is completely airtight, the expansion and contraction of gas in the case due to temperature changes causes a difference in pressure between the inside and outside of the case, and excessively encumbers the case. Accordingly, the case needs to remain capable of allowing gas to enter and exit from it, while preventing liquid from entering.

Patent Document 1 describes a vent cap composed of a cover component having a cylinder shape with a bottom, and a cylindrical body fitting within the cover component, wherein a labyrinthine vent passage is formed between the inner periphery of the cover component and the outer periphery of the cylindrical body, and also between the bottom surface of the cover component and the bottom portion of the cylindrical body, so that the vent cap exhibits waterproofness and air permeability.

Patent Document 2 describes a ventable plug to be attached to an electric motor case for automotive power windows. In a sheet joining portion of this cylindrical plug body, an air-permeable sheet is formed so as to close the inside of the plug body, so that water is prevented from entering the motor case, and the function of an air-permeable membrane allows ventilation between the inside and outside of the case. In Patent Document 2, the plug body portion is formed in an outer portion of the plug, and is formed so as to protrude above a plane including the air-permeable membrane. Thus, during the operation of attaching the ventable plug to the motor case, the protruding part serves as a protective dike, and therefore, a hand does not often make contact with the air-permeable membrane. This contributes to the prevention of breakage of the air-permeable membrane.

PRIOR ART DOCUMENTS

Patent Document

Patent Document 1: Japanese Patent Laid-open Publication No. 2001-143524 (FIG. 1)

Patent Document 2: Japanese Patent Laid-open Publication No. 2003-63549 (FIGS. 1 and 2)

DISCLOSURE OF THE INVENTION

Problems to be Solved by the Invention

As described above, the protruding part of the plug body portion of Patent Document 2 has a certain effect of preventing the air-permeable membrane from breaking. However, the presence of the protruding part makes liquid, such as water and oil, unlikely to be discharged to the outside of the plug, and the air-permeable membrane is covered by the liquid. This reduces the effective opening area of a ventable region, and therefore, the air permeability of the air-permeable membrane becomes decreased.

In view of such circumstances, it is an object of the present invention to provide a vent plug making liquid unlikely to accumulate therein, while preventing an air-permeable membrane from breaking, using a convex part (a protruding part) of a plug body portion.

Means of Solving the Problems

The vent plug of the present invention, which can achieve the above object, comprises a cylindrical member having a through-hole, and an air-permeable membrane attached around the cylindrical member, wherein the air-permeable membrane has a circumferential attachment region which is in contact with the cylindrical member, and an air-permeable region facing the through-hole, and the cylindrical member is provided with at least one convex part which projects beyond the plane including the air-permeable region, and the circumferential attachment region of the air-permeable membrane has a shape following a part or the entire of the convex part.

In the above vent plug, the range in which, among straight lines extending from the center of the ventilation region to the circumferential attachment region, those blocked by the convex part are present, may preferably be set to be 180 degrees or larger in 360 degrees around the circumferential attachment region.

In the above vent plug, an outer peripheral portion of the circumferential attachment region may desirably be in contact with a lateral surface portion of the cylindrical member 1.

In the above vent plug, the cylindrical member may desirably comprise two or more convex parts as described above.

In the above vent plug, the height of the convex part may desirably be discontinuous in the circumferential direction of the circumferential attachment region.

In the above vent plug, recommended is such an embodiment that the outer peripheral portion of the circumferential attachment region extends beyond the top portion of the convex part.

In the above vent plug, recommended is such an embodiment that a stepped part is formed in the circumferential attachment region and inside the top portion of the convex part.

In the above vent plug, recommended is such an embodiment that the vent plug has a flat part in an inner peripheral portion of the circumferential attachment region, so that the flat part and the ventilation region are included in the same plane.

In the above vent plug, the air-permeable membrane may preferably be composed of a fluororesin.

In the above vent plug, the fluororesin may preferably be porous polytetrafluoroethylene.

In the above vent plug, the air-permeable membrane may desirably have liquid-repellent property.

Effects of the Invention

In the vent plug of the present invention, the air-permeable membrane is mounted so as to cover the convex part of the cylindrical member. This reduces the blocking of liquid by the convex part, and causes the liquid to be discharged smoothly to the outside of the vent plug. That is, it is easy for the liquid to pass along the air-permeable membrane, and therefore, the liquid is unlikely to accumulate in the vent plug. This makes it possible to maintain high air permeability even in a harsh usage environment, such as outdoors.

MODE FOR CARRYING OUT THE INVENTION

1. Structure of Vent Plug

The structures of vent plugs according to embodiments of the present invention will be described below by reference to the drawings.

(Embodiment 1)

Figure 1:
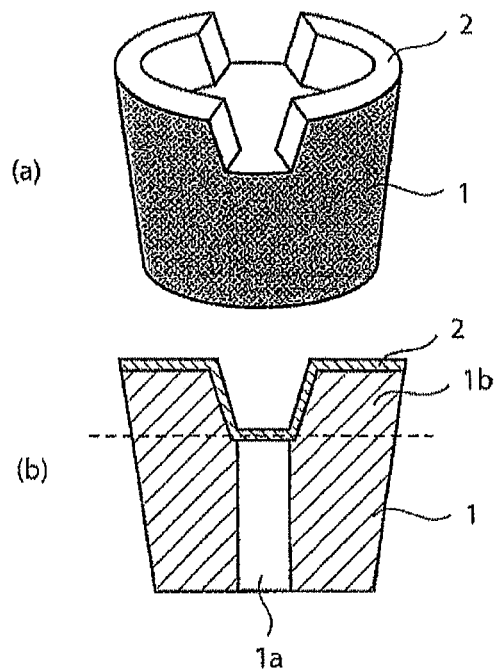
FIG. 1(a) is a perspective view of a vent plug according to Embodiment 1 of the present invention.
FIG. 1(b) is a cross-sectional view of the vent plug.

FIG. 1 shows a vent plug according to Embodiment 1 of the present invention. FIG. 1(a) is a perspective view; and FIG. 1(b) is a cross-sectional view in the vertical direction of an air-permeable membrane included in the vent plug. As shown in FIG. 1, a cylindrical member 1 has a through-hole 1a, and an air-permeable membrane 2 is mounted on an upper portion of the cylindrical member 1. The portion of the air-permeable membrane 2, which is in circumferential contact with the cylindrical member 1, is referred to as a "circumferential attachment region." Further, the portion of the air-permeable membrane 2, which is not in contact with the cylindrical member 1, but faces the through-hole 1a, allows ventilation through the through-hole 1a, and therefore, it is referred to as a "ventilation region."

The cylindrical member 1 includes a convex part 1b that protrudes above a plane including the ventilation region of the air-permeable membrane 2 (i.e., a plane represented by a dashed line in FIG. 1(b)). The convex part 1b serves as a protective dike, and therefore, it prevents the hand or others of a worker from making direct contact with the air-permeable membrane 2 during, for example, the operation of handling the vent plug. This makes it possible to reduce the probability of the air-permeable membrane 2 breaking. In this connection, the convex part 1b may be integrally formed with the cylindrical member 1 as a part thereof, or may be a separate component added to the cylindrical member 1.

The air-permeable membrane 2 according to Embodiment 1 of the present invention is formed so as to cover the convex part 1b in the circumferential attachment region, and is shaped along the surface shape of the convex part 1b. Accordingly, droplets present in the ventilation region of the air-permeable membrane 2 smoothly travel on the air-permeable membrane 2 from the ventilation region to the circumferential attachment region without being blocked by the convex part 1b. This makes the droplets unlikely to accumulate in the vent plug, and therefore, this makes it possible to retain the effective opening area of the air-permeable membrane 2 even in a harsh usage environment, such as outdoors and in an engine room, and maintain high air permeability.

Figure 2:
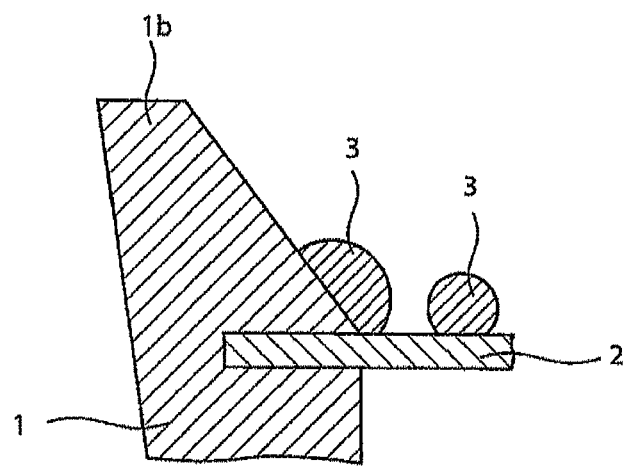
FIG. 2 is a partial cross-sectional view of a conventional vent plug.
Figure 3:
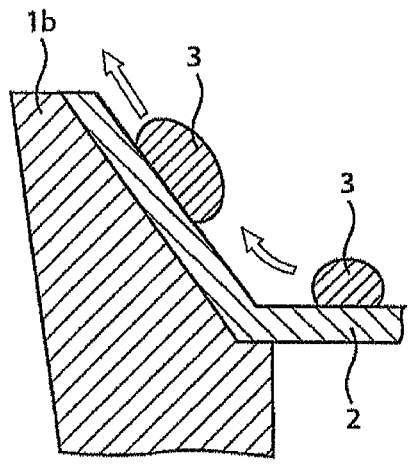
FIG. 3 is a partial cross-sectional view of a vent plug of the present invention.

FIGS. 2 and 3 illustrate, in detail, droplets flowing. FIG. 2 is a partial cross-sectional view of a conventional vent plug, wherein an air-permeable membrane 2 is fixed within a cylindrical member 1, and the air-permeable membrane 2 is not formed along the surface of a convex part 1b. Accordingly, the base of the ascent from a ventilation region of the air-permeable membrane 2 to the convex part 1b of the cylindrical member 1 is a boundary between dissimilar materials. In general, liquid tends to accumulate in a capillary portion, and therefore, in the vent plug of FIG. 2, liquid is likely to accumulate in the boundary between the air-permeable membrane 2 and the convex part 1b (i.e., in the corner of the air-permeable membrane 2).

Droplets 3 accumulated in the boundary between the air-permeable membrane 2 and the convex part 1b reduce the effective opening area of the air-permeable membrane 2. In contrast, in the vent plug according to the present invention shown in a partial cross-sectional view of FIG. 3, the air-permeable membrane 2 is formed continuously along the surface shape of the convex part 1b. Thus, a tilt, vibrations, or the like of the vent plug cause droplets 3 on the air-permeable membrane 2 to smoothly flow to the outside.

Although the component material of the air-permeable membrane 2 will be described in detail later, if the component material of the air-permeable membrane 2 has water-repellent function (or oil-repellent function) greater than that of the component material of the cylindrical member 1, water, oil, and others on the air-permeable membrane 2 are discharged smoothly with increased effect. It is possible to evaluate the water/oil-repellent function of the air-permeable membrane 2, at the portion in which the surface of the air-permeable membrane 2 is in contact with the surface of the droplets 3, by the angle between a tangent line to the surfaces of the droplets 3 and the surface of the air-permeable membrane 2. For example, the above angle is large if the cylindrical member 1 has low water/oil-repellent function, and therefore, the flow of the droplets 3 deteriorates as shown in FIG. 2. On the other hand, the above angle is small as shown in FIG. 3 if the air-permeable membrane 2 has high water/oil-repellent function, and therefore, the droplets 3 are discharged smoothly while rolling on the air-permeable membrane 2.

In the vent plug according to Embodiment 1 of the present invention, an outer peripheral portion of the circumferential attachment region of the air-permeable membrane 2 is in contact with a lateral surface portion of the cylindrical member 1. This is to securely guide the droplets 3 to the lateral surface portion of the vent plug. Even if, however, the air-permeable membrane 2 does not reach the lateral surface portion of the cylindrical member 1, it is possible to remedy the blocking of the flow of droplets by the convex part 1b, so long as the air-permeable membrane 2 is formed so as to cover at least a part of the convex part 1b.

As shown in FIG. 1, if two (or three or more) convex parts 1b are formed in the cylindrical member 1, the presence of two or more convex parts 1b makes it possible to prevent, with increased certainty, breakage of the air-permeable membrane 2, which can occur during the operation of handling the vent plug. Further, an increase in the number of the convex parts 1b to be provided complicates the shape of the cylindrical member 1, and therefore, it enhances the fixation effect of the cylindrical member 1 and the air-permeable membrane 2. In short, it is only necessary that the heights of the convex parts 1b are discontinuous in the circumferential direction of the circumferential attachment region of the air-permeable membrane 2. Further, the presence of two or more convex parts 1b also makes it possible to provide a space between one convex part 1b and another convex part 1b adjacent thereto. With such a space, the droplets 3 are discharged with increased smoothness.

However, it should be avoided that a wide space is provided between one convex part 1b and another convex part 1b adjacent thereto. The provision of a certain space between the convex parts 1b is of significance, and therefore, the widening of the space does not make much difference on the effect of the discharge of droplets. Meanwhile, if the space is too wide, it is not possible to achieve the original purpose of the convex parts 1b according to the present invention of preventing a hand from making direct contact with the air-permeable membrane 2, using the convex parts 1b as protective dikes.

Thus, it is desirable that in the vent plug according to the present embodiment, the range in which, among straight lines extending from the center of the ventilation region to the circumferential attachment region, those blocked by the convex part 1b are present, should be 180 degrees or larger in 360 degrees around the circumferential attachment region.

More specifically, a description is given by reference to FIG. 16 described below. As shown in FIG. 16(b), it is desirable that the range in which, among straight lines extending from the center of the ventilation region to the circumferential attachment region, those blocked by the convex part 1b (dashed arrows) are present, should be 180 degrees or larger (preferably 210 degrees or larger, and more preferably 240 degrees or larger) in 360 degrees around the circumferential attachment region. In other words, it is desirable that the range in which the straight lines not blocked by the convex part 1b (solid arrows) are present, that is, the sum of angles $\alpha$, should be smaller than 180 degrees (preferably smaller than 150 degrees, and more preferably smaller than 120 degrees). In this connection, the description is given here taking as an example the case where the ventilation region is a circle; however, when the ventilation region is not a circle, the center of gravity of the ventilation region is regarded as the center of the ventilation region.

As described above, in the present invention, the straight lines are blocked if the convex part 1b is present in the circumferential attachment region, whereas the straight lines are not blocked if the convex part 1b is not present. It is, however, also possible to limit the definition of "being blocked" to a narrower definition, if necessary. For example, as shown in FIG. 16(a), the region in which an angle of elevation $\beta$ from the center of the circle to the convex part 1b is 15 degrees or larger (more preferably 30 degrees or larger) may be defined as the region in which "straight lines extending from the center of the ventilation region to the circumferential attachment region are blocked by the convex part 1b." This makes it possible to obtain a vent plug in which the convex part 1b has a greater function of protection against hands and fingers. Meanwhile, an upper limit of the angle of elevation $\beta$ is not particularly limited; however, the angle of elevation $\beta$ is, for example, 60 degrees or smaller, or 45 degrees or smaller.

As a matter of course, even if the convex part 1b is formed around the entire circumference of the cylindrical member 1, the vent plug according to the present invention can efficiently discharge the droplets 3, so long as the air-permeable membrane 2 is formed so as to cover at least a part of the convex part 1b.

The vent plug according to Embodiment 1 of the present invention is used, for example, in a hold case for electric devices, the case being needed to have both air-permeability and waterproofness. In the hold case, for example, a circular hole is bored, and the vent plug is attached so as to be inserted into the hole. As shown in FIG. 1, if the cylindrical member 1 of the vent plug has a tapered shape, it is possible to securely insert the vent plug into the hole.

(Embodiment 2)

Figure 4:
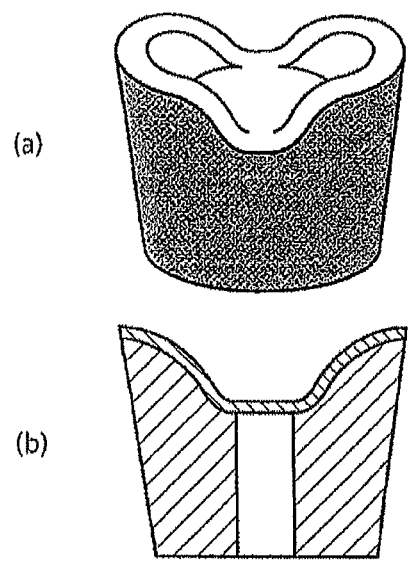
FIG. 4(a) is a perspective view of a vent plug according to Embodiment 2 of the present invention.
FIG. 4(b) is a cross-sectional view of the vent plug.

FIG. 4 shows a vent plug according to Embodiment 2 of the present invention. FIG. 4(a) is a perspective view; and FIG. 4(b) is a cross-sectional view in the vertical direction of an air-permeable membrane included in the vent plug. The vent plug according to Embodiment 2 has a structure basically similar to that of the vent plug according to Embodiment 1. As shown in FIG. 4, however, the convex part 1b of the vent plug according to Embodiment 2 does not include angular portions, but includes gently curved surfaces. The gentleness of the surfaces of the convex part 1b causes droplets to flow with increased smoothness. The radius of curvature of each of the surfaces of the convex part 1b may desirably be 0.5 mm or larger. In this connection, while the vent plug is repeatedly handled, noticeable dirt is attached to the angular portions of the convex part 1b in a concentrated manner, and therefore, the commercial value of the vent plug decreases. If, however, the surfaces of the convex part 1b are gentle, attached dirt is not noticeable. Further, this also prevents the abrasion of the corners of a filter, and also has an effect of improving the performance of protecting the filter.

(Embodiment 3)

Figure 5:
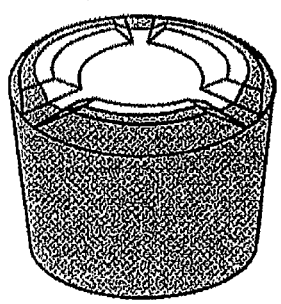
FIG. 5 is a perspective view of a vent plug according to Embodiment 3 of the present invention.

In Embodiment 3 and thereafter, other variations of the vent plug according to the present invention will be described. FIG. 5 is a perspective view of a vent plug according to Embodiment 3 of the present invention. In the vent plug according to Embodiment 3, convex parts 1b are formed at three positions. Due to the three convex parts 1b, there are also three spaces between the convex parts 1b. Accordingly, droplets accumulated on the inner side of the vent plug are easily discharged to the outside. In the vent plug according to Embodiment 3, the air-permeable membrane 2 is slightly small, and therefore, the outer peripheral portion of the circumferential attachment region of the air-permeable membrane 2 does not reach the lateral surface of the cylindrical member 1. This structure, however, is sufficient to smoothly guide droplets to the top portions of the convex parts 1b.

Figure 6:
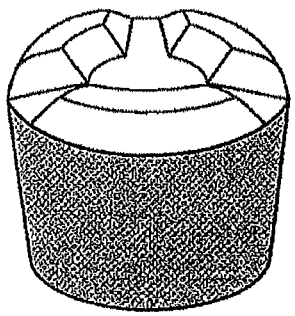
FIG. 6 is a perspective view of another vent plug according to Embodiment 3 of the present invention.

FIG. 6 is a perspective view of another vent plug according to Embodiment 3 of the present invention. The vent plug shown in FIG. 6 is an embodiment in which the outer peripheral portion of the circumferential attachment region of the air-permeable membrane 2 extends beyond the top portions of the convex parts 1b. This has an effect of securely discharging droplets to the outside of the vent plug.

As shown in FIGS. 5 and 6, a circumferential cross-sectional shape of each of the convex parts 1b is trapezoidal. Such a trapezoidal cross-sectional shape forms inclines on the inner and outer sides of the vent plug, and therefore, this makes it possible to discharge droplets with increased smoothness.

(Embodiment 4)

Figure 7:
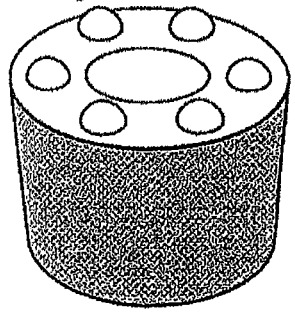
FIG. 7 is a perspective view of a vent plug according to Embodiment 4 of the present invention.

FIG. 7 is a perspective view of a vent plug according to Embodiment 4 of the present invention. The shape of each of convex parts 1b of the vent plug according to Embodiment 4 is spherical. The vent plug according to the present embodiment provides a structure in which liquid is unlikely to accumulate within the vent plug due to gentle surface shapes of the convex parts 1b, while the convex parts 1b of the vent plug prevent the air-permeable membrane from breaking.

(Embodiment 5)

Figure 8:
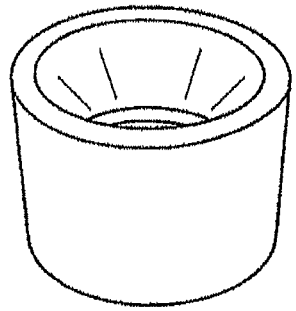
FIG. 8 is a perspective view of a vent plug according to Embodiment 5 of the present invention.

FIG. 8 is a perspective view of a vent plug according to Embodiment 5 of the present invention. In the vent plug according to Embodiment 5, the air-permeable membrane 2 covers also the lateral surface of the cylindrical member 1, and therefore, droplets are discharged very smoothly from the inner side to the outer side of the vent plug. Further, the area of contact between the air-permeable membrane 2 and the cylindrical member 1 is very large, and therefore, the air-permeable membrane 2 is unlikely to peel off from the cylindrical member 1. This significantly increases the life of the vent plug.

(Embodiment 6)

Figure 9:
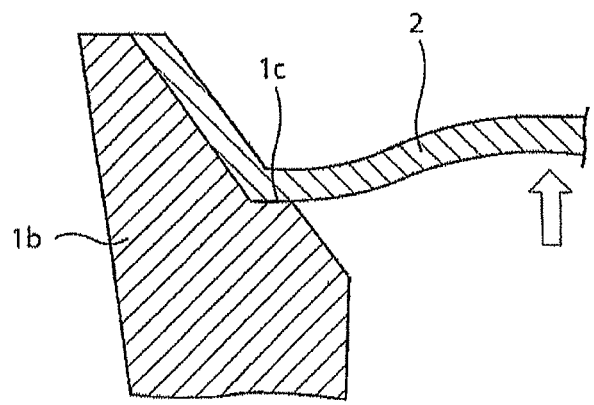
FIG. 9 is a partial cross-sectional view of a vent plug according to Embodiment 6 of the present invention.

FIG. 9 is a partial cross-sectional view of a vent plug according to Embodiment 6 of the present invention, enlarging the convex part 1b in particular. The vent plug according to Embodiment 6 is an embodiment in which a stepped part 1c is formed in the circumferential attachment region of the air-permeable membrane 2 and inside the top portion of the convex part 1b. In the present invention, the stepped part refers to a portion in which the angle of inclination of the surface of the convex part 1b is locally small. The angle of inclination being small means that the angle between an incline of the convex part 1b and a plane including the ventilation region of the air-permeable membrane 2 is small.

In the air-permeable membrane 2 according to the present invention, minute air holes are formed so as to allow gas to pass therethrough. At the interface between the cylindrical member 1 and the air-permeable membrane 2, the strength of fixation between the cylindrical member 1 and the air-permeable membrane 2 is increased by an anchor effect in which parts of the cylindrical member 1 enter inside the air holes of the air-permeable membrane 2. In the incline portion of the convex part 1b, however, the minute air holes are relatively small because the minute air hole structures of the air-permeable membrane 2 are deformed by the pressure applied in molding, and therefore, the cylindrical member 1 is unlikely to enter the air holes of the air-permeable membrane 2. This decreases the strength of fixation between the cylindrical member 1 and the air-permeable membrane 2.

In the vent plug according to Embodiment 6 of the present invention, the provision of the portion in which the angle of inclination of the surface of the convex part 1b is locally small, that is, the provision of the stepped part 1c in the incline, makes it possible to locally alleviate the reduction of the strength of fixation between the cylindrical member 1 and the air-permeable membrane 2.

The presence of the stepped part 1c as described above makes it possible that even if a large differential pressure is temporarily applied from below the ventilation region as shown in FIG. 9 and the air-permeable membrane 2 is folded over along the incline of the convex part 1b, the stepped part 1c serves the function of stopping peeling, and prevents the complete separation of the air-permeable membrane 2.

2. Detailed Description of Respective Elements of Vent Plug

The vent plug of the present invention was described above for its structure by reference to Embodiments 1 to 6, the following will describe the details (preferred materials and others) of the cylindrical member 1 and the air-permeable membrane 2.

(1) Cylindrical Member

The cylindrical member 1 may preferably be formed of an elastic resin, in view of its application in which the vent plug is inserted into a part of an electric device as described above. Examples of the resin may desirably include predominantly olefin elastic resins, such as Santoprene and Milastomer; rubber-based or rubber-substitute elastic resins, such as ethylene-propylene rubber (EPDM), acrylic rubber, silicon rubber, and fluoro-rubber; and those which contain polypropylene (PP). To easily insert the vent plug according to the present invention into a part of an electric device, the hardness (JIS K 6253) of the cylindrical member 1 is 100 degrees or smaller, more preferably 80 degrees or smaller. To secure the sealing properties of the cylindrical member, the hardness is 10 degrees or larger, more preferably 40 degrees or larger. The hardness of rubber is measured by the use of a durometer (available from Shimadzu Corporation, DUROMETER A).

It is desirable that the height of the convex part 1b of the cylindrical member 1 in proportion to the diameter of the through-hole 1a may preferably be set to be 5% to 200%, more preferably 10% to 100%, and still more preferably 15% to 50%.

(2) Air-Permeable Membrane

As the constituent material of the air-permeable membrane 2, there may be used polyethylene, polypropylene, polystyrene, polyimide, or others, and it is recommended to use preferably a film formed of a fluorocarbon resin having high waterproofness, more preferably porous polytetrafluoroethylene (porous PTFE). The microscopic shape of the air-permeable membrane 2 may be a net shape, a mesh shape, or a porous shape. A porous PTFE film is highly waterproof, and therefore, it is suitable for applications in which air permeability is provided between the inside and outside of an electronic device, while water droplets, oil droplets, dust, and others are prevented from entering the electronic device.

The porous PTFE film is obtained by mixing PTFE fine powder with a molding aid to form a paste; molding the paste to form a molded product; removing the molding aid from the molded product; subsequently expanding the molded product at a high temperature and at a high speed; and if necessary, sintering the expanded molded product. A uniaxially expanded porous PTFE film has nodes (folded crystals) arranged orthogonal to the expanding direction in a thin island manner, and fibrils (linear molecule bundles in which folded crystals have been unraveled and pulled out by the expanding) oriented in the expanding direction in a reed-screen manner so as to connect the nodes. This leads to a fibrous structure in which the spaces defined by fibrils and the spaces defined by fibrils and nodes are holes. A biaxially stretched porous PTFE film has fibrils extending in a radial manner, and this leads to a spider's-web-like fibrous structure in which nodes connecting fibrils are interspersed in an island manner, and there are many spaces defined by the fibrils and the nodes.

The air-permeable membrane 2 may be a uniaxially expanded porous PTFE film or a biaxially expanded porous PTFE film.

The air-permeable membrane 2 preferably has a sufficient strength to be used solely (as a single layer), but may be used in a layered manner with an air-permeable reinforcing layer which has stretch properties and can preferably endure a high temperature of 120° C., such as nonwoven fabric and a net of woven fabric, knitted fabric, or others.

The air-permeable membrane 2 may preferably have the following physical properties: a resistance to water pressure of 1 kPa or higher, more preferably 10 kPa or higher; and an air permeability (JIS P 8117) of 1,000 seconds or lower, more preferably 100 seconds or lower.

The surfaces inside the pores of the air-permeable membrane 2 may preferably be provided with liquid repellency. When the air-permeable membrane 2 is provided with liquid repellency, it is possible to prevent various contaminants, such as body oils, machine oils, and water droplets, from penetrating into, or being held in, the pores of the air-permeable membrane. The contaminants reduce the collection characteristics and the air permeability of the air-permeable membrane, and result in impairing the functions of the air-permeable membrane. In this connection, the entire surface of the cylindrical member 1 may be provided with liquid repellency.

In the claims and the present description, it is possible to perform the method of providing liquid repellency, also by using a liquid-repellent material or adding a liquid-repellent agent. In this case, "liquid-repellent" refers to the property or the function of repelling liquid, and examples of the "liquid-repellent agent" may include "water-repellent agents", "oil-repellent agents", and "water/oil-repellent agents". The following will be described taking a water/oil-repellent polymer as an example.

As the water/oil-repellent polymer, there may be, for example, polymers each having fluorinated side chains. The water/oil-repellent polymer and a method of forming a composite of the water/oil-repellent polymer and a porous PTFE film are disclosed in the International Publication WO 94/22928 and others. An example thereof is shown below.

As the water/oil-repellent polymer, there may preferably be used polymers each having fluorinated side chains (the fluorinated alkyl moieties of which may preferably have from 4 to 16 carbon atoms), which polymers are obtained by polymerizing a fluoroalkyl acrylate(s) and/or a fluoroalkyl methacrylate(s) of the following general formula (1):

[Chemical Formula 1]

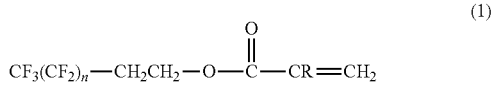

(1)

wherein n is an integer of from 3 to 13 and R is hydrogen or methyl group. To coat the inside of the pores of the above porous PTFE film with the polymer, an aqueous micro-emulsion (having an average particle diameter of from 0.01 to 0.5 μm) of the polymer is prepared using a fluorinated surfactant (e.g., ammonium perfluoro-octanoate), and the inside of the pores of the porous PTFE film is impregnated with the aqueous micro-emulsion, followed by heating. As a result of the heating, the water and the fluorinated surfactant are removed, and the polymer having fluorinated side chains melts and coats the surfaces inside the pores of the porous PTFE film so that continuous pores are maintained. Thus, an air-permeable membrane having high water repellency and high oil repellency is obtained.

(3) Others

To join the cylindrical member 1 and the air-permeable membrane 2, it is possible to use a method of compression-bonding the air-permeable membrane 2 to the cylindrical member 1 melted as described below, and it is also possible to use a double-sided pressure-sensitive adhesive tape. These are, however, not essential elements of the present invention. The double-sided pressure-sensitive adhesive tape may be various types of tapes, such as nonwoven-fabric-backed double-sided pressure-sensitive adhesive tape, of which core is a polyethylene nonwoven fabric, a polypropylene nonwoven fabric, a nylon nonwoven fabric, or others; PET-backed double-sided pressure-sensitive adhesive tapes; polyimide-backed double-sided pressure-sensitive adhesive tapes; nylon-backed double-sided pressure-sensitive adhesive tapes; foam (e.g., urethane foam, silicone foam, acrylic foam, polyethylene foam)-backed double-sided pressure-sensitive adhesive tapes; and backingless double-sided pressure-sensitive adhesive tapes.

3. Variations of Vent Plug

The vent plug according to the present invention is directly or indirectly attached to, for example, a case (housing) in which an electronic component is held. Various changes, however, can be made in the shape of the cylindrical member 1 depending on the shape of the portion to which the cylindrical member 1 is attached.

Figure 10:
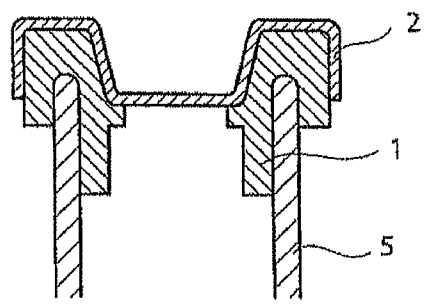
FIG. 10 is a cross-sectional view of a modified example of the present invention.

As shown in FIG. 10, when the vent plug is attached to an end portion of a vent pipe 5, the cylindrical member 1 may be shaped to fit both the inside and outside of the vent pipe 5. This increases the attachment strength of the vent plug.

Figure 11:
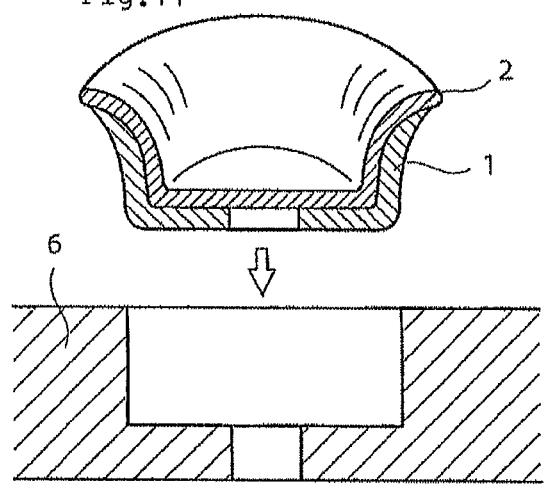
FIG. 11 is a cross-sectional view of another modified example of the present invention.

As shown in FIG. 11, when the vent plug is attached to a hole having a bottom, which is provided in a part of a case (housing) 6, the cylindrical member 1 may be formed into a bowl-like shape. This makes it possible to produce a vent plug that has excellent shielding properties and also has excellent attachment strength, due to its excellent fit with the hole.

4. Production Process of Vent Plug

Examples of a process applicable to the production of the vent plug according to the present invention will be described below.

(1) Injection Molding

Injection molding is a method in which a melted thermoplastic resin is pressed into a mold processed to have a predetermined hollow shape, and subsequently, the thermoplastic resin is cooled to obtain a molded product of the vent plug. The process steps are shown in the process cross-sectional views of FIGS. 12(a) to 12(c).

Figure 12:
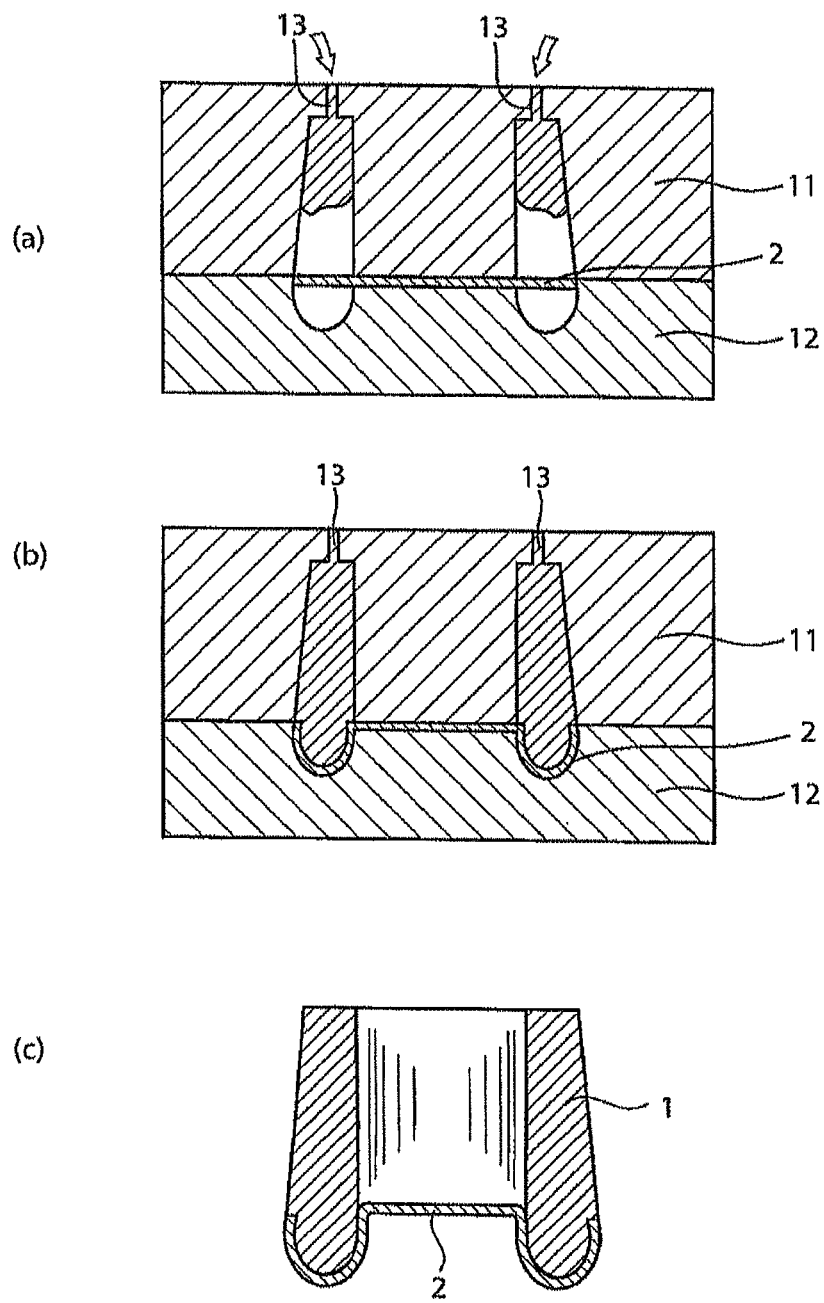
FIGS. 12(a) to 12(c) are process cross-sectional views showing a production process for a vent plug of the present invention.

First, as shown in FIG. 12(a), a first mold 11 and a second mold 12 are placed face-to-face and brought into close contact with each other, so that a cavity having the shape of a cylindrical member 1 is formed in the molds. An air-permeable membrane 2 is sandwiched in advance between the first mold 11 and the second mold 12.

Then, as shown in FIG. 12(b), a melted thermoplastic resin is injected into the first mold 11 through an inlet 13. When the thermoplastic resin has reached the air-permeable membrane 2, the thermoplastic resin presses down the air-permeable membrane 2 to the bottom of the second mold 12. Thus, the air-permeable membrane 2 is formed according to the shape of the thermoplastic resin. At this time, the spaces of the air-permeable membrane 2 (e.g., a PTFE porous body) are impregnated with the resin by the injection pressure of the resin, and then, the resin is cured by cooling, so that the resin (i.e., the molded cylindrical member 1) and the air-permeable membrane 2 are strongly fixed to each other by an anchor effect.

Finally, as shown in FIG. 12(c), the first mold 11 and the second mold 12 are removed, so that a vent plug can be obtained in which the cylindrical member 1 and the air-permeable membrane 2 are integrated with each other.

(2) Compression Molding

The process steps are similar to those of the injection molding described above, but compression molding is a method in which a resin capable of being cured by vulcanization (e.g., a rubber-based material such as EPDM described above) is pressed by a high-pressure pressing machine into a mold processed to have a predetermined shape; and subsequently, the resin is cured by vulcanization to obtain a molded product of the vent plug. The spaces of the air-permeable membrane 2 (e.g., a PTFE porous body) are impregnated with the resin by the injection pressure of the resin, and then, the resin is cured by cooling, so that a strong fixation effect can be obtained by an anchor effect.

(3) Other Methods

It is also possible that the cylindrical member 1 is first molded solely by molding process such as injection molding or compression molding, and subsequently, the air-permeable membrane 2 is fixed to the circumferential attachment region of the cylindrical member 1, using a welding member of a predetermined shape. For the fixation, there is also a method in which the cylindrical member 1 is melted by reheating, the spaces of the air-permeable membrane 2 (e.g., a PTFE porous body) are impregnated with the melted resin; and the cylindrical member 1 is solidified by cooling, so that a vent plug is obtained in which the cylindrical member 1 and the air-permeable membrane 2 are integrated with each other.

Further, it is also possible to adhere the cylindrical member 1 formed of a resin to the air-permeable membrane 2, using an adhesive, and it is also possible to fix the cylindrical member 1 and the air-permeable membrane 2 to each other with a double-sided tape, as has already been described in detail.

5. Production Examples

In addition to Embodiments 1 to 6 described above, vent plugs of various shapes were produced, and therefore, the structures of these vent plugs are also described below.

(Production Example 1)

Figure 13:
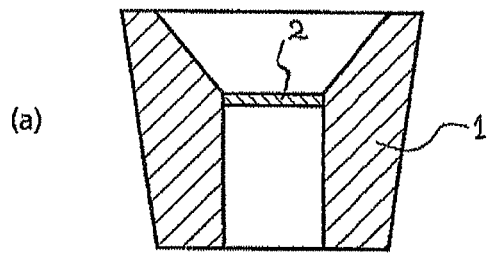
FIG. 13(a) is a cross-sectional view of a vent plug according to Production Example 1 of the present invention.
FIG. 13(b) is a top view of the vent plug.
Figure 13:
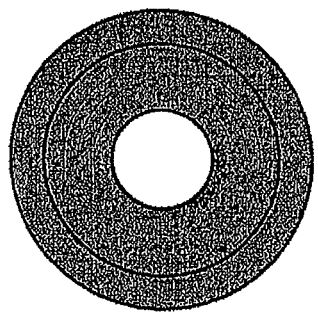

FIG. 13 shows a vent plug according to Production Example 1 (a conventional vent plug). FIG. 13(a) is a cross-sectional view in the vertical direction of an air-permeable membrane 2 included in the vent plug; and FIG. 13(b) is a top view of the vent plug. As shown in FIG. 13, a convex part 1b is formed in the vent plug; however, the air-permeable membrane is not formed according to the convex part 1b. That is, the air-permeable membrane 2 does not have any circumferential attachment region defined in the present invention.

(Production Example 2)

Figure 14:
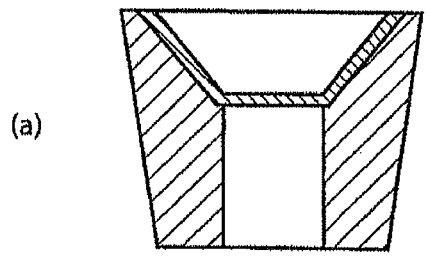
FIG. 14(a) is a cross-sectional view of a vent plug according to Production Example 2 of the present invention.
FIG. 14(b) is a top view of the vent plug.
Figure 14:
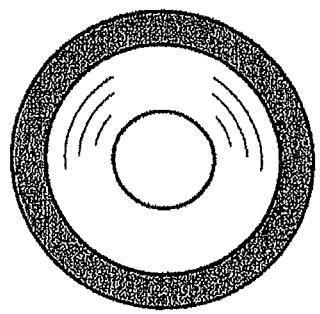

FIG. 14 shows a vent plug according to Production Example 2. FIG. 14(a) is a cross-sectional view in the vertical direction of an air-permeable membrane 2 included in the vent plug; and FIG. 14(b) is a top view of the vent plug. As shown in FIG. 14, the air-permeable membrane 2 is shaped according to a part of the convex part 1b.

(Production Example 3)

Figure 15:
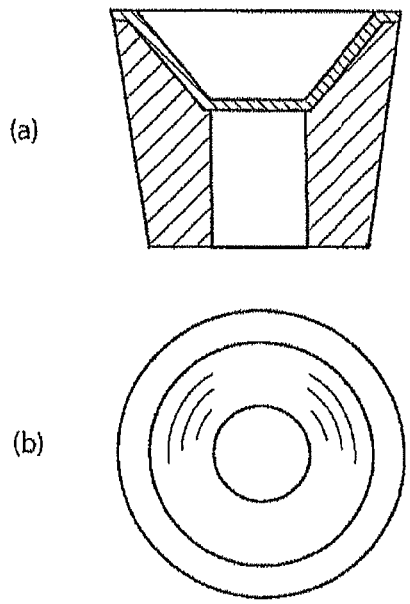
FIG. 15(a) is a cross-sectional view of a vent plug according to Production Example 3 of the present invention.
FIG. 15(b) is a top view of the vent plug.

FIG. 15 shows a vent plug according to Production Example 3. FIG. 15(a) is a cross-sectional view in the vertical direction of an air-permeable membrane 2 included in the vent plug; and FIG. 15(b) is a top view of the vent plug. As shown in FIG. 15, the air-permeable membrane 2 is shaped according to the convex part 1b so that the outer peripheral portion of the circumferential attachment region is in contact with the lateral surface portion of the cylindrical member.

(Production Example 4)

Figure 16:
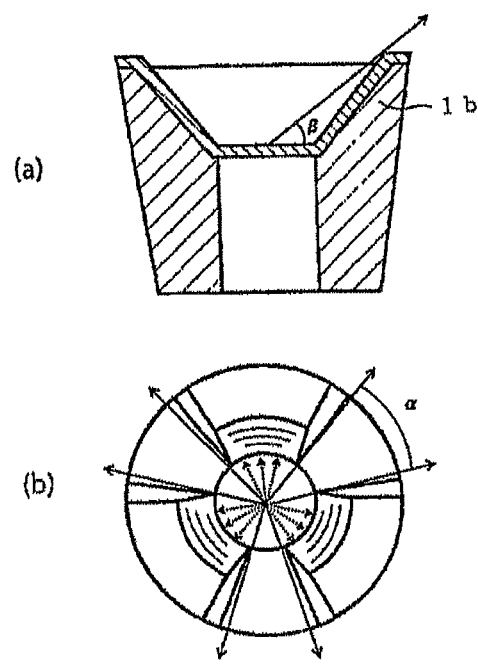
FIG. 16(a) is a cross-sectional view of a vent plug according to Production Example 4 of the present invention.
FIG. 16(b) is a top view of the vent plug.

FIG. 16 shows a vent plug according to Production Example 4. FIG. 16(a) is a cross-sectional view in the vertical direction of an air-permeable membrane 2 included in the vent plug; and FIG. 16(b) is a top view of the vent plug. As shown in FIG. 16, three convex parts 1b are formed independently of each other in the cylindrical member 1.

(Production Example 5)

Figure 17:
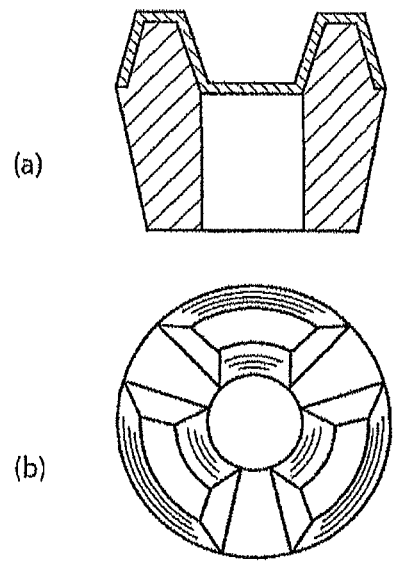
FIG. 17(a) is a cross-sectional view of a vent plug according to Production Example 5 of the present invention.
FIG. 17(b) is a top view of the vent plug.

FIG. 17 shows a vent plug according to Production Example 5. FIG. 17(a) is a cross-sectional view in the vertical direction of an air-permeable membrane 2 included in the vent plug; and FIG. 17(b) is a top view of the vent plug. As shown in FIG. 17, three convex parts are formed in the cylindrical member 1, and the outer peripheral portion of the circumferential attachment region of the air-permeable membrane 2 is provided so as to extend beyond the top portions of the convex parts 1b.

(Production Example 6)

Figure 18:
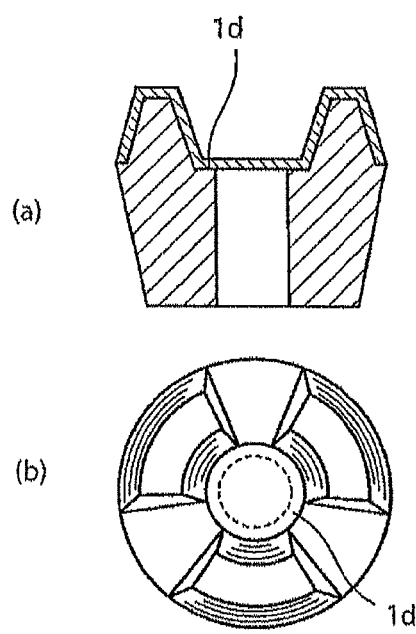
FIG. 18(a) is a cross-sectional view of a vent plug according to Production Example 6 of the present invention.
FIG. 18(b) is a top view of the vent plug.

FIG. 18 shows a vent plug according to Production Example 6. FIG. 18(a) is a cross-sectional view in the vertical direction of an air-permeable membrane 2 included in the vent plug; and FIG. 18(b) is a top view of the vent plug. As shown in FIG. 18, the vent plug according to Production Example 6 has a structure basically similar to that of the vent plug according to Production Example 5. The vent plug according to Production Example 6, however, includes a flat part 1d in an inner peripheral portion of the circumferential attachment region of the air-permeable membrane 2, so that the flat part 1d and the ventilation region are included in the same plane. That is, there are no ascending slopes and no barriers from the ventilation region to the inner peripheral portion of the circumferential attachment region. This makes it possible to discharge droplets from the ventilation region with increased smoothness.

In each of Production Examples 1 to 6, using a rubber compression molding machine (available from Meiki Co., Ltd.; R-series, mold clamping force: 70 tons) and metal-made molds having cavities of predetermined shapes, the vent plugs were obtained by placing an air-permeable membrane at a predetermined position in the molds, subsequently pressing an unvulcanized rubber into the molds, and curing the rubber by vulcanization. In this connection, EPDM was used as the resin forming the cylindrical member 1, and an oil-repellent PTFE membrane (having a pore diameter of 1 μm, a thickness of 300 μm, and a porosity of 60% (all nominal values)) was used as the air-permeable membrane 2.

6. Test Examples

Using Production Examples 1 (Conventional Example), 3, 4, and 6 from the above Production Examples, two drops (about 0.4 g) of water were precipitated onto the ventilation region of the air-permeable membrane of each vent plug, and the vent plug was gradually tilted from the state in which the ventilation region was horizontal. Then, the angle of the vent plug was confirmed when the water droplets had fallen from the vent plug. The results are shown in Table 1.

TABLE 1

| Production Examples | Production Example 1 | Production Example 3 | Production Example 4 | Production Example 6 |
| --- | --- | --- | --- | --- |
| Tilt angle of vent plug (degree) (when water droplets had fallen) | 91.3 | 67.7 | 46.7 | 32.3 |

The following discussions can be made from the results in Table 1. In Production Example 1 (a conventional example), the water droplets were finally discharged when the vent plug was tilted even as far as at 91.3 degrees. In Production Example 3 in which the air-permeable membrane is shaped along the convex part, the water droplets were discharged when the vent plug was tilted at 67.7 degrees. It is considered that in Production Example 3, the presence of the air-permeable membrane formed along the convex part caused the water droplets to flow smoothly. In Production Example 4 in which the three convex parts are formed independently of each other in the cylindrical member, the water droplets smoothly flowed from between one convex part and another convex part. The water droplets were discharged when the vent plug was tilted at only 46.7 degrees.

Further, in Production Example 6, as described above, there are no barriers from the ventilation region to the inner peripheral portion of the circumferential attachment region, and therefore, it is possible to discharge droplets from the ventilation region to the circumferential attachment region with increased smoothness. Thus, the water droplets were discharged when the vent plug was tilted at only 32.3 degrees.

EXPLANATION OF NUMERALS

1 Cylindrical member
1*a* Though-hole
1*b* Convex part
1*c* Stepped part
1*d* Flat part
2 Air-permeable membrane
3 Liquid droplet
5 Vent pipe
6 Case (housing)
11 First mold
12 Second mold
13 Inlet

What is claimed is:

1. A vent plug comprising a cylindrical member having a through-hole, and an air-permeable membrane attached around the cylindrical member, wherein the air-permeable membrane has a circumferential attachment region which is in contact with the cylindrical member, and an air-permeable region facing the through-hole, and the cylindrical member is provided with at least one convex part which projects beyond the plane including the air-permeable region, and the circumferential attachment region of the air-permeable membrane has a shape following a part or the entire of the convex part.

2. The vent plug according to claim 1, wherein the range in which, among straight lines extending from the center of the ventilation region to the circumferential attachment region, those blocked by the convex part are present, is 180 degrees or larger in 360 degrees around the circumferential attachment region.

3. The vent plug according to claim 1, wherein an outer peripheral portion of the circumferential attachment region is in contact with a lateral surface portion of the cylindrical member 1.

4. The vent plug according to claim 1, wherein the cylindrical member comprises two or more convex parts as described above.

5. The vent plug according to claim 1, wherein the height of the convex part is discontinuous in the circumferential direction of the circumferential attachment region.

6. The vent plug according to claim 1, wherein the outer peripheral portion of the circumferential attachment region extends beyond the top portion of the convex part.

7. The vent plug according to claim 1, wherein a stepped part is formed in the circumferential attachment region and inside the top portion of the convex part.

8. The vent plug according to claim 1, which has a flat part in an inner peripheral portion of the circumferential attachment region, so that the flat part and the ventilation region are included in the same plane.

9. The vent plug according to claim 1, wherein the air-permeable membrane is composed of a fluororesin.

10. The vent plug according to claim 9, wherein the fluororesin is porous polytetrafluoroethylene.

11. The vent plug according to claim 1, wherein the air-permeable membrane has liquid-repellent property.

* * * * *